US012573947B2

(12) United States Patent
Hinrichs

(10) Patent No.: US 12,573,947 B2
(45) Date of Patent: Mar. 10, 2026

(54) DUTY CYCLE CORRECTOR SYSTEMATIC OFFSET REDUCTION

(71) Applicant: QUALCOMM Incorporated, San Diego, CA (US)

(72) Inventor: Jeffrey Mark Hinrichs, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 12 days.

(21) Appl. No.: 18/626,770

(22) Filed: Apr. 4, 2024

(65) Prior Publication Data

US 2025/0317055 A1 Oct. 9, 2025

(51) Int. Cl.
*H02M 3/07* (2006.01)
*H03K 5/156* (2006.01)
*H03L 7/089* (2006.01)

(52) U.S. Cl.
CPC ............ *H02M 3/07* (2013.01); *H03K 5/1565* (2013.01); *H03L 7/0895* (2013.01)

(58) Field of Classification Search
CPC ........ H02M 3/07; H02M 3/073; H02M 3/158; H02M 1/08; H02M 1/32; H02M 3/071; H02M 3/156; H02M 3/155; H02M 3/145; H02M 3/10; H02M 3/06; H02M 3/04; H02M 3/02
See application file for complete search history.

(56) References Cited

U.S. PATENT DOCUMENTS

| | | | |
|---|---|---|---|
| 7,705,649 B1 | 4/2010 | Yu et al. | |
| 8,018,269 B2 * | 9/2011 | Wang .................... | H03L 7/0896 |
| | | | 327/536 |
| 9,124,250 B2 | 9/2015 | Hinrichs | |
| 2009/0121759 A1 | 5/2009 | Wang et al. | |

FOREIGN PATENT DOCUMENTS

| | | |
|---|---|---|
| EP | 3512102 A1 | 7/2019 |
| WO | 2015017233 | 2/2015 |
| WO | 2018080687 A1 | 5/2018 |

OTHER PUBLICATIONS

International Search Report and Written Opinion—PCT/US2025/015103—ISA/EPO—Apr. 23, 2025.

* cited by examiner

*Primary Examiner* — Diana J. Cheng
(74) *Attorney, Agent, or Firm* — Loza & Loza, LLP

(57) ABSTRACT

A charge pump includes a first transistor, a first switch coupled between the first transistor and an output of the charge pump, a second transistor, and a second switch coupled between the output of the charge pump and the second transistor. The charge pump also includes a third transistor, wherein a gate of the third transistor is coupled to a gate of the first transistor, a fourth transistor, wherein a drain of the fourth transistor is coupled to a drain of the third transistor, and a bias circuit configured to bias a gate of the fourth transistor and a gate of the second transistor. The charge pump also includes an amplifier having a first input coupled to the output of the charge pump, a second input coupled to the drain of the third transistor, and the output coupled to the gate of the third transistor.

19 Claims, 10 Drawing Sheets

1000

Sense a first voltage at an output of the charge pump — 1010

Sense a second voltage at the drain of the third transistor — 1020

Drive the gate of the third transistor in a direction that reduces a difference between the second voltage and the first voltage — 1030

DUTY CYCLE CORRECTOR SYSTEMATIC OFFSET REDUCTION

BACKGROUND

Field

Aspects of the present disclosure relate generally to charge pumps, and more particularly, to a charge pump with systematic offset reduction.

Background

A charge pump may be configured to tune (i.e., adjust) a control voltage on a capacitor (e.g., in a duty cycle corrector) by controlling the flow of current into and out of the capacitor based on one or more input signals. For example, in a duty cycle corrector, the control voltage may control the duty cycle of a clock signal. In this example, the charge pump may be coupled in a feedback loop that causes the charge pump to tune the control voltage in a direction that reduces an error between the duty cycle of the clock signal and a target duty cycle.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes a charge pump including a first transistor, a first switch coupled between a drain of the first transistor and an output of the charge pump, a second transistor, and a second switch coupled between the output of the charge pump and a drain of the second transistor. The charge pump also includes a third transistor, wherein a gate of the third transistor is coupled to a gate of the first transistor, a fourth transistor, wherein a drain of the fourth transistor is coupled to a drain of the third transistor, and a bias circuit configured to bias a gate of the fourth transistor and a gate of the second transistor. The charge pump also includes a first amplifier having a first input, a second input, and an output, wherein the first input of the first amplifier is coupled to the output of the charge pump, the second input of the first amplifier is coupled to the drain of the third transistor, and the output of the first amplifier is coupled to the gate of the third transistor. The system also includes a first capacitor coupled to the output of the charge pump.

A second aspect relates to a method for operating a charge pump. The charge pump includes a first transistor providing a first current, a second transistor providing a second current, a third transistor, a fourth transistor, and a bias circuit biasing a gate of the second transistor and a gate of the fourth transistor, wherein a gate of the third transistor is coupled to a gate of the first transistor, and a drain of the third transistor is coupled to a drain of the fourth transistor. The method includes sensing a first voltage at an output of the charge pump, sensing a second voltage at the drain of the third transistor, and driving the gate of the third transistor in a direction that reduces a difference between the second voltage and the first voltage.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
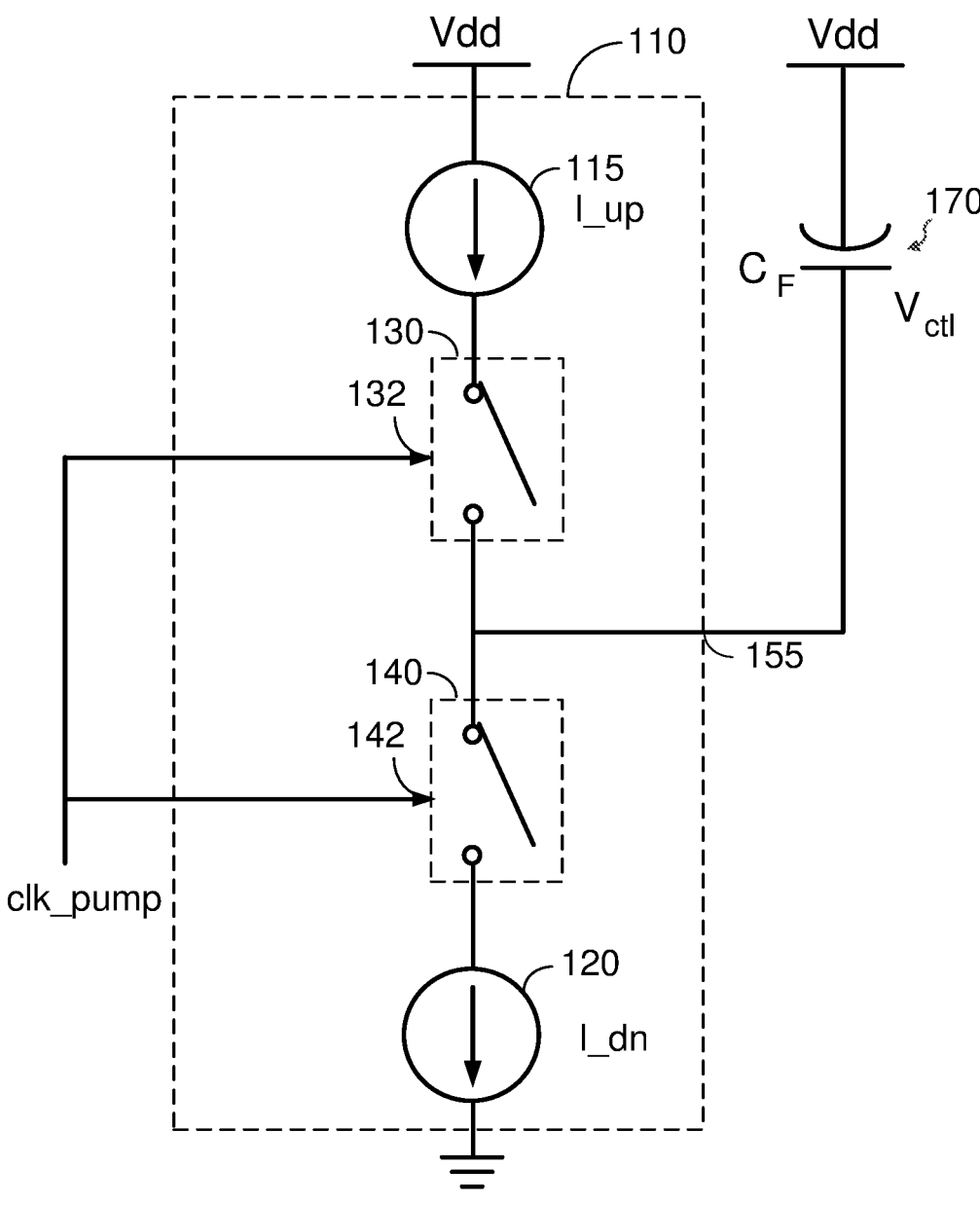
FIG. 1 shows an example of a charge pump according to certain aspects of the present disclosure.

FIG. 1 shows an example of a charge pump 110 according to certain aspects. The charge pump 110 is configured to tune (i.e., adjust) a control voltage $V_{ctl}$ on a capacitor 170 by controlling the flow of current into and out of the capacitor 170 based on one or more input signals. For example, the charge pump 110 may be used in a duty cycle corrector to turn a control voltage $V_{ctl}$ that controls the duty cycle of a clock signal, as discussed further below. In this example, the charge pump 110 may be coupled in a feedback loop that causes the charge pump 110 to tune the control voltage $V_{ctl}$ in a direction that reduces an error between the duty cycle of the clock signal and a target duty cycle (e.g., 50 percent duty cycle). However, it is to be appreciated that the charge pump 110 is not limited to a duty cycle corrector, and that the charge pump 110 may be used to tune a control voltage in other types of circuit such as a phase locked loop (PLL). For the example of a PLL, the charge pump 110 may tune a control voltage that controls an output frequency of the PLL based on a phase error signal from a phase detector.

In the example in FIG. 1, the charge pump 110 includes a first current source 115, a second current source 120, a first switch 130, and a second switch 140. The first current source 115 and the first switch 130 are coupled in series between a supply rail having a supply voltage of Vdd and an output 155 of the charge pump 110. The first switch 130 has a control input 132 configured to control an on/off state of the first switch 130 based on an input signal (e.g., an input voltage) at the control input 132. For example, the first switch 130 may be configured to turn on when the input voltage is low (e.g., ground potential) and turn off when the input voltage is high (e.g., Vdd), or vice versa.

The second current source 120 and the second switch 140 are coupled in series between the output 155 of the charge pump 110 and ground. The second switch 140 has a control input 142 configured to control an on/off state of the second switch 140 based on an input signal (e.g., an input voltage) at the control input 142. For example, the second switch 140 may be configured to turn on when the input voltage is high (e.g., Vdd) and turn off when the input voltage is low (e.g., ground potential), or vice versa.

Each of the switches 130 and 140 may be implemented with a transistor, a transmission gate, or another type of switch. For example, the first switch 130 may be implemented with a p-type field effect transistor (PFET) and the second switch 140 may be implemented with an n-type field effect transistor (NFET) in some implementations, as discussed further below.

In this example, the output 155 of the charge pump 110 is coupled to the capacitor 170. The capacitor 170 integrates current from the charge pump 110 to generate the control voltage $V_{ctl}$ discussed above. In the example in FIG. 1, the capacitor 170 is coupled between the output 155 of the charge pump 110 and the supply rail. However, it is to be appreciated that the present disclosure is not limited to this example, and that the capacitor 170 may be coupled between the output 155 of the charge pump 110 and ground in other implementations.

In this example, the first current source 115 is configured to source current I_up to the capacitor 170 when the first switch 130 is turned on (i.e., closed). In this case, the current I_up flows into the capacitor 170, which causes the control voltage $V_{ctl}$ on the capacitor 170 to increase (e.g., ramp up).

The second current source 120 is configured to draw current I_dn from the capacitor 170 when the second switch 140 is turned on (i.e., closed). In this case, the current I_dn flows out of the capacitor 170, which causes the control voltage $V_{ctl}$ on the capacitor 170 to decrease (e.g., ramp down). In certain aspects, the currents I_up and I_dn are approximately equal.

In the example shown in FIG. 1, the on/off states of the switches 130 and 140 are controlled by a clock signal clk_pump input to the control inputs 132 and 142 of the switches 130 and 140, respectively. A used herein, a "clock signal" is a periodic signal that alternates between high (e.g., Vdd) and low (e.g., ground potential).

In this example, the first switch 130 is configured to turn on when the clock signal clk_pump is low (e.g., ground potential) and turn off when the clock signal clk_pump is high (e.g., Vdd), and the second switch 140 is configured to turn on when the clock signal clk_pump is high and turn off when the clock signal is low. Thus, in this example, the first switch 130 and the second switch 140 alternately turn on in which the first switch 130 turns on when clock signal clk_pump is low and the second switch 140 turns on when the clock signal clk_pump is high. As a result, the first current source 115 sources the current I_up to the capacitor 170 through the first switch 130 when the clock signal clk_pump is low, and the second current source 120 draws the current I_dn from the capacitor 170 through the second switch 140 when the clock signal clk_pump is high. In this example, the first switch 130 may be implemented with a PFET and the second switch 140 may be implemented with an NFET. However, it is to be appreciated that the first switch 130 and the second switch 140 are not limited to this example.

In this example, the charge pump 110 may tune (i.e., adjust) the control voltage $V_{ctl}$ on the capacitor 170 based on the duty cycle of the clock signal clk_pump. As used herein, the "duty cycle" of a clock signal is the fraction of a period of the clock signal in which the clock signal is high. The fraction may be expressed as a percentage or a ratio. In this example, the charge pump 110 decreases the control voltage $V_{ctl}$ when the duty cycle of the clock signal clk_pump is greater than 50 percent. This is because the second switch 140 is turned on for a longer duration than the first switch 130 during each clock period when the duty cycle is greater than 50 percent. As a result, the amount of charge pulled from the capacitor 170 by the second current source 120 is greater than the amount of charge supplied to the capacitor 170 by the first current source 115 during each clock period, which decreases the control voltage $V_{ctl}$.

In this example, the charge pump 110 increases the control voltage $V_{ctl}$ when the duty cycle of the clock signal clk_pump is less than 50 percent. This is because the first switch 130 is turned on for a longer duration than the second switch 140 during each clock period when the duty cycle is less than 50 percent. As a result, the amount of charge supplied to the capacitor 170 by the first current source 115 is greater than the amount of charged pulled from the capacitor 170 by the second current source 120 during each clock period, which increases the control voltage $V_{ctl}$.

In this example, the control voltage $V_{ctl}$ may reach a steady state when the duty cycle of the clock signal clk_pump is approximately 50 percent. This is because the first switch 130 and the second switch 140 are turned on for approximately the same duration (i.e., half a clock period) during each clock period when the duty cycle is 50 percent. As a result, the amount of charge supplied to the capacitor 170 by the first current source 115 is approximately equal to the amount of charged pulled from the capacitor 170 by the second current source 120 during each clock period (assuming the currents I_up and I_dn are equal).

It is to be appreciated that the charge pump 110 is not limited to the clock signal clk_pump, and that other types of signals may be input to the control inputs 132 and 142 of the switches 130 and 140, respectively. For example, in a PLL, up pulses and down pulses may be input to the control inputs 132 and 142, respectively, from a phase detector.

Figure 2:
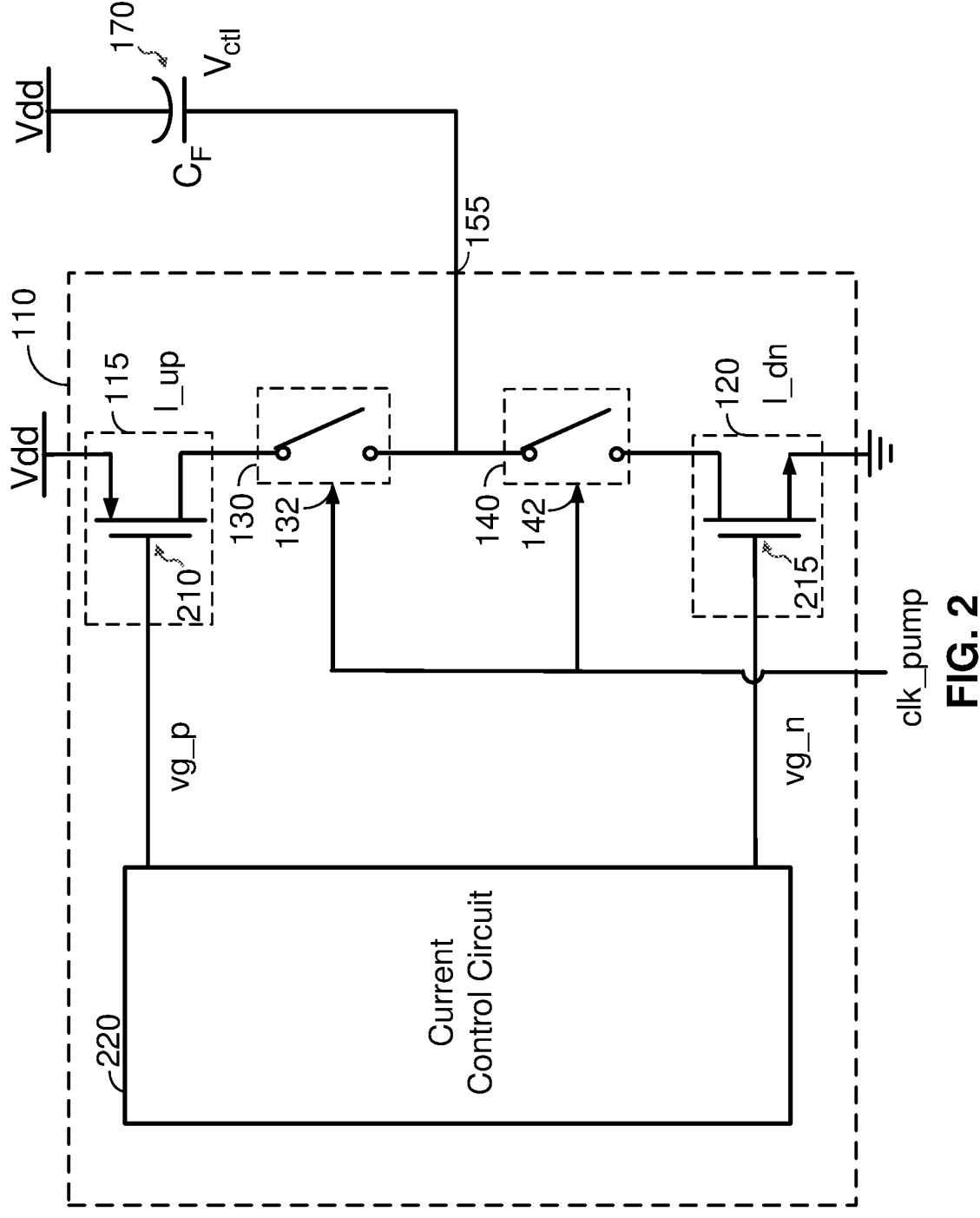
FIG. 2 shows an exemplary implementation of current sources in the charge pump according to certain aspects of the present disclosure.

FIG. 2 shows an exemplary implementation of the first current source 115 and the second current source 120 according to certain aspects. In this example, the first current source 115 includes a first transistor 210 (e.g., a PFET) and the second current source 120 includes a second transistor 215 (e.g., an NFET). The source of the first transistor 210 is coupled to the supply rail, and the first switch 130 is coupled between the drain of the first transistor 210 and the output 155 of the charge pump 110. The source of the second transistor 215 is coupled to ground, and the second switch 140 is coupled between the output 155 of the charge pump 110 and the drain of the second transistor 215.

In this example, the charge pump 110 includes a current control circuit 220 coupled to the gate of the first transistor 210 and the gate of the second transistor 215. The current control circuit 220 is configured to bias the gate of the first transistor 210 with gate voltage vg_p and bias the gate of the second transistor 215 with gate voltage vg_n. In this example, the current control circuit 220 sets the current I_up of the first current source 115 by setting the gate voltage vg_p of the first transistor 210. For the example where the first transistor 210 is a PFET, the current control circuit 220 may set the current I_up at a higher current by lowering the gate voltage vg_p. The current control circuit 220 also sets the current I_dn of the second current source 120 by setting the gate voltage vg_n of the second transistor 215. For the example where the second transistor 215 is an NFET, the current control circuit 220 may set the current I_dn to a higher current by raising the gate voltage vg_n.

Figure 3:
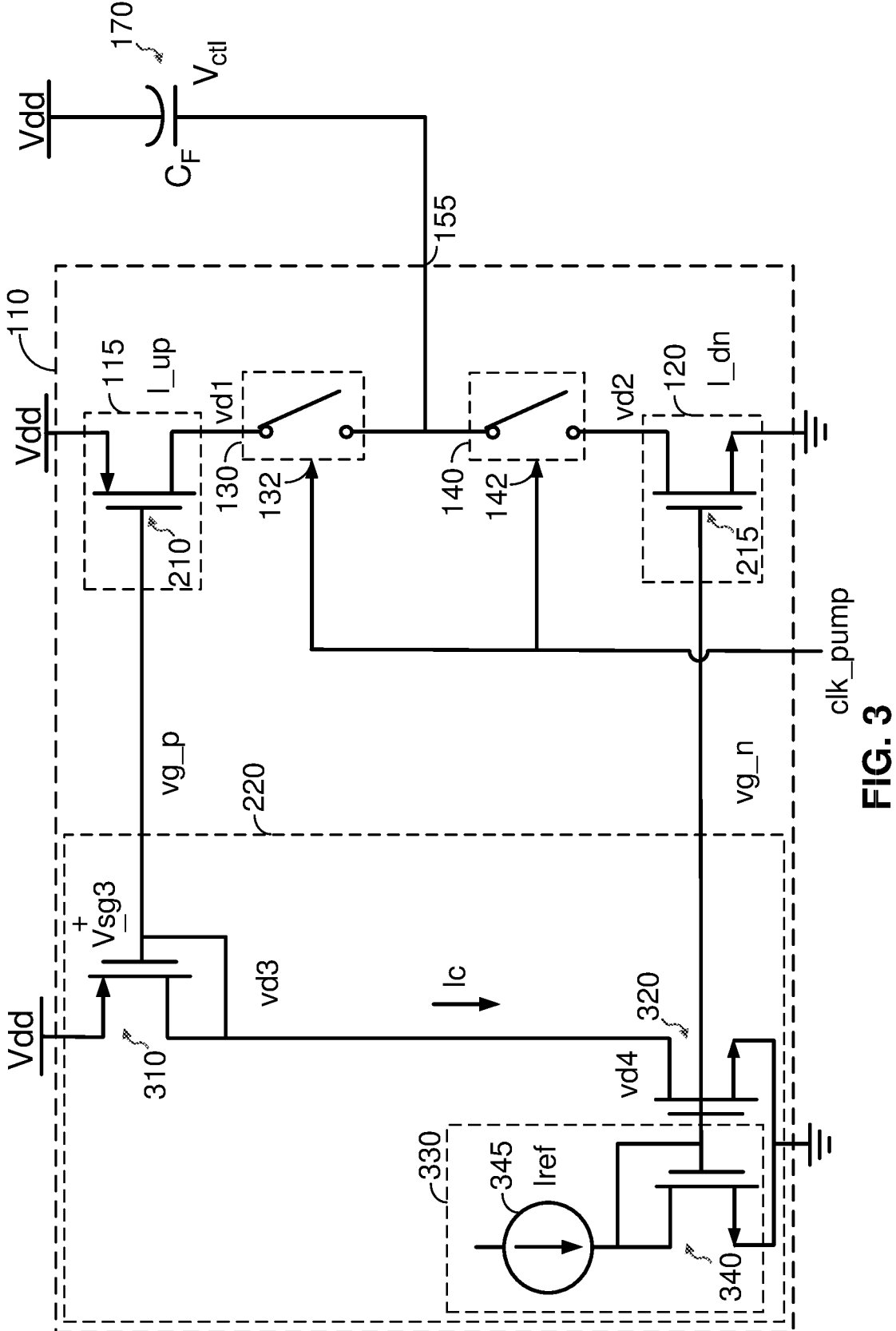
FIG. 3 shows an exemplary implementation of a current control circuit configured to set the currents of the current sources of FIG. 2 according to certain aspects of the present disclosure.

FIG. 3 shows an exemplary implementation of the current control circuit 220 in which the current control circuit 220 generates the gate voltages vg_p and vg_n for the first transistor 210 and the second transistor 215, respectively, based on a reference current Iref. In this example, the current control circuit 220 includes a third transistor 310 (e.g., a PFET), a fourth transistor 320 (e.g., an NFET), and a gate bias circuit 330.

In the example in FIG. 3, the source of the third transistor 310 is coupled to the supply rail, and the gate of the third transistor 310 is coupled to the drain of the third transistor 310. The gate of the third transistor 310 is also coupled to the gate of the first transistor 210. In this example, the third transistor 310 and the first transistor 210 are coupled in a current-mirror configuration in which the first transistor 210 mirrors the current flowing through the third transistor 310, as discussed further below.

The drain of the fourth transistor 320 is coupled to the drain of the third transistor 310 such that the current Ic flowing through the fourth transistor 320 flows through the third transistor 310. The source of the fourth transistor 320 is coupled to ground.

The gate bias circuit 330 is coupled to the gate of the fourth transistor 320 and the gate of the second transistor 215. The gate bias circuit 330 is configured to generate the gate voltage vg_n based on the reference current Iref, and output the gate voltage vg_n to the gate of the fourth transistor 320 and the gate of the second transistor 215. In the example in FIG. 3, the gate bias circuit 330 includes a fifth transistor 340 and a reference current source 345 configured to generate the reference current Iref. The reference current source 345 is coupled to the drain of the fifth transistor 340. The gate of the fifth transistor 340 is coupled to the drain of the fifth transistor 340. The gate of the fifth transistor 340 is also coupled to the gate of the fourth transistor 320 and the second transistor 215.

In operation, the reference current Iref from the reference current source 345 flows through the fifth transistor 340. The reference current Iref flowing through the fifth transistor 340 produces the gate voltage vg_n at the gate of the fifth transistor 340. The gate voltage vg_n biases the gate of the second transistor 215 such that the current I_dn of the second current source 120 mirrors the reference current Iref. The gate voltage vg_n also biases the gate of the fourth transistor 320 such that the current Ic of the fourth transistor 320 mirrors the reference current Iref.

The current Ic flowing through the fourth transistor 320 flows through the third transistor 310, as discussed above. The current Ic flowing through the third transistor 310 produces the gate voltage vg_p at the gate of the third transistor 310. The gate voltage vg_p biases the gate of the first transistor 210 such that the current I_up of the first current source 115 mirrors the current Ic, which, in turn, mirrors the reference current Iref. Thus, the current I_up of the first current source 115 mirrors the reference current Iref.

Thus, in this example, the current I_up of the first current source 115 and the current I_dn of the second current source 120 mirror the reference current Iref. For the example where transistors 210, 215, 310, and 320 have the same channel width, the current I_up of the first current source 115 and the current I_dn of the second current source 120 are approximately equal. However, in practice, mismatches between the transistors 210, 215, 310, and 320 cause a mismatch between the current I_up of the first current source 115 and the current I_dn of the second current source 120. The current mismatch can cause a duty cycle offset when the charge pump 110 is used in a duty cycle corrector. The current mismatch can also cause a phase offset when the charge pump 110 is used in a PLL.

Mismatches between the transistors 210, 215, 310, and 320 may include random mismatches (e.g., due to process variation) and systematic mismatches due to the design of the charge pump 110. For example, mismatches in the drain voltages of the transistors 210, 215, 310, and 320 due to the design of the charge pump 110 may cause a systematic current mismatch between the first current source 115 and the second current source 120. When the charge pump 110 is used in a duty cycle corrector, the systematic current mismatch results in a systematic duty cycle offset.

FIG. 3 shows an example of the drain voltages of the transistors 210, 215, 310, and 320. In this example, the drain voltage vd1 of the first transistor 210 and the drain voltage vd2 of the second transistor 215 are each approximately equal to the control voltage $V_{ctl}$ when the respective switch 130 and 140 is closed. This assumes that charge sharing error is negligible. An exemplary technique for reducing the charge sharing error is discussed further below.

The drain voltage vd3 of the third transistor 310 is approximately equal to the gate voltage vg_p at the gate of the third transistor 310, which is equal to Vdd−Vsg3 where Vsg3 is the source-to-gate voltage of the third transistor 310. This is because the drain of the third transistor 310 is coupled to the gate of the third transistor 310. The drain voltage vd4 of the fourth transistor 320 is also approximately equal to Vdd−Vsg3 since the drain of the fourth transistor 320 is coupled to the drain of the third transistor 310.

Thus, in this example, the drain voltage vd1 of the first transistor 210 and the drain voltage vd2 of the second transistor 215 are each approximately equal to the control voltage $V_{ctl}$ while the drain voltage vd3 of third transistor 310 and the drain voltage vd4 of the fourth transistor 320 are each approximately equal to Vdd−Vsg3, which is different from the control voltage $V_{ctl}$. In other words, the drain voltages vd1 and vd2 of the first and second transistors 210 and 215 are mismatched with the drain voltages vd3 and vd4 of the third and fourth transistors 310 and 320. The drain voltage mismatch results in a systematic current mismatch between the first current source 115 and the second current source 120 due to channel length modulation of the transistors 210, 215, 310, and 320 (which is a function of drain voltage). When the charge pump 110 is used in a duty cycle corrector, the systematic current mismatch results in a systematic duty cycle offset.

To address the above, aspects of the present disclosure provide a feedback loop that forces the drain voltages vd3 and vd4 of the third transistor 310 and the fourth transistor 320 to be approximately equal to the drain voltages vd1 and vd2 of the first transistor 210 and the second transistors 215 in the current sources 115 and 120. This reduces the systematic current mismatch between the first current source 115 and the second current source 120 due to drain voltage mismatch. The above features and other features of the present disclosure are discussed further below.

Figure 4:
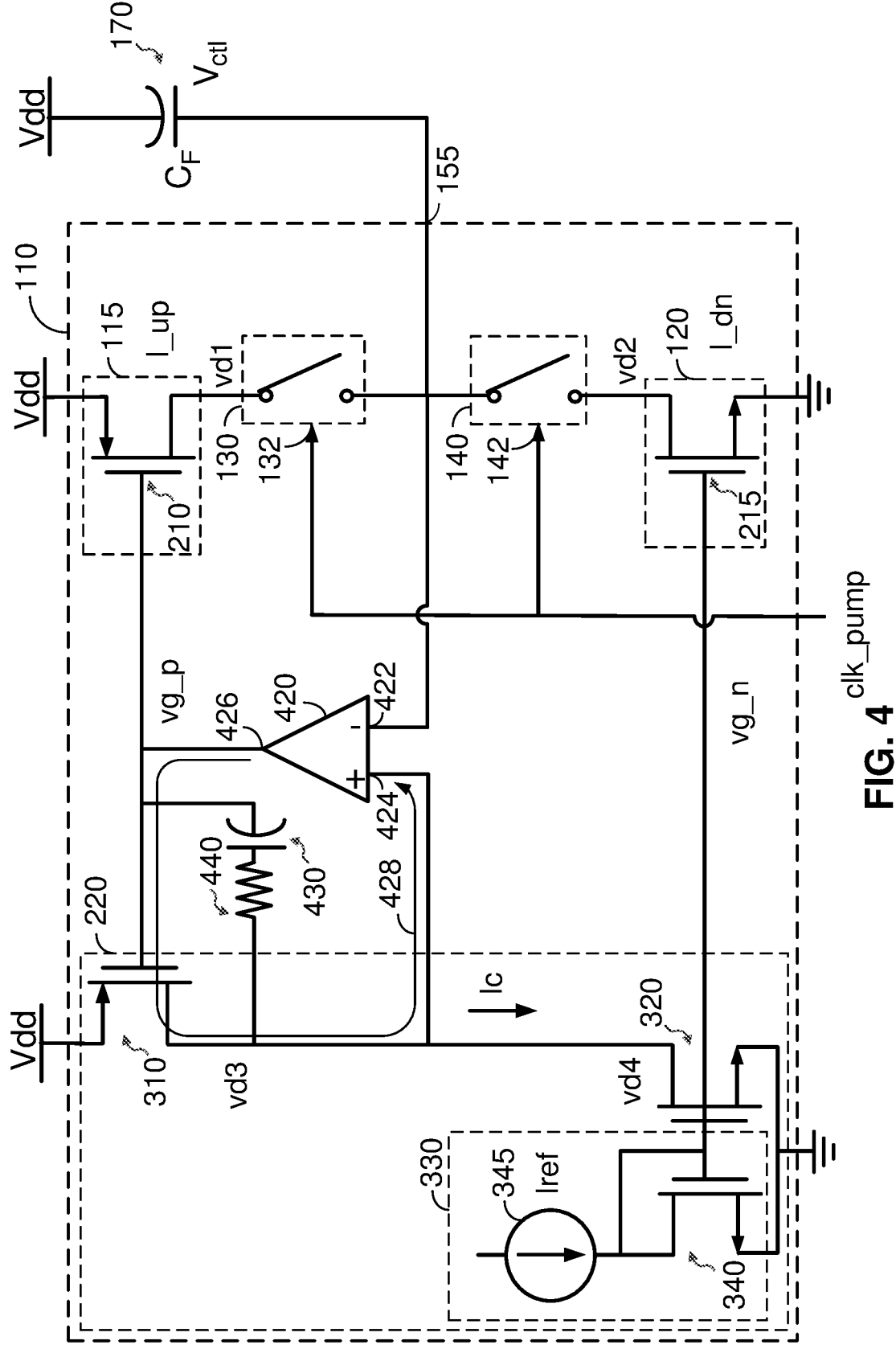
FIG. 4 shows an example in which the charge pump includes a feedback loop for reducing drain voltage mismatch according to certain aspects of the present disclosure.

FIG. 4 shows an example in which the charge pump 110 includes an amplifier 420 (e.g., an operational amplifier). The amplifier 420 is coupled in a feedback loop that forces the drain voltages vd3 and vd4 of the third transistor 310 and the fourth transistor 320 to be approximately equal to the drain voltages vd1 and vd2 of the first transistor 210 and the second transistors 215 in the current sources 115 and 120, as discussed further below.

In this example, the amplifier 420 has a first input 422 (e.g., minus input), a second input 424 (e.g., a plus input), and an output 426. The first input 422 is coupled to the output 155 of the charge pump 110, the second input 424 is coupled between the drain of the third transistor 310 and the drain of the fourth transistor 320, and the output 426 is coupled to the gates of the third transistor 310 and the first transistor 210. Thus, the output 426 drives the gate of the third transistor 310. In this example, the amplifier 420 and the third transistor 310 are coupled in a negative feedback loop 428 with two gain stages in which the two gain stages include the gain of the amplifier 410 and the gain of the third transistor 310 (which acts as a common-source amplifier).

In operation, the amplifier 420 senses the control voltage $V_{ctl}$ at the first input 422 since the first input 422 is coupled to the output 155 of the charge pump 110, and senses the drain voltage vd3 of the third transistor 310 at the second input 424 since the second input 424 is coupled to the drain of the third transistor 310. The feedback loop 428 causes the amplifier 420 to adjust the gate voltage vg_p at the gate of the third transistor 310 such that the drain voltage vd3 at the second input 424 of the amplifier 420 is approximately equal to the control voltage $V_{ctl}$ at the first input 422 of the amplifier 420. Thus, the feedback loop 428 forces the drain voltage vd3 of the third transistor 310 to be approximately equal to the control voltage $V_{ctl}$. Since the drain of the fourth transistor 320 is coupled to the drain of the third transistor 310, the feedback loop 428 also forces the drain voltage Vd4 of the fourth transistor 320 to be approximately equal to the control voltage $V_{ctl}$.

Thus, the feedback loop 428 forces the drain voltage vd3 of third transistor 310 and the drain voltage vd4 of the fourth transistor 320 to each be approximately equal to the control voltage $V_{ctl}$. Since the drain voltage vd1 of the first transistor 210 and the drain voltage vd2 of the second transistor 215 are each approximately equal to the control voltage $V_{ctl}$, the feedback loop 428 forces the drain voltages vd3 and vd4 of the third and fourth transistors 310 and 320 to approximately match the drain voltages vd1 and vd2 of the first and second transistors 210 and 215. This reduces the systematic current mismatch between the first current source 115 and the second current source 120 caused by drain voltage mismatch. For the example where the charge pump 110 is used in a duty cycle corrector, the reduction in the systematic current mismatch reduces the systematic duty cycle offset, thereby improving the performance of the duty cycle corrector.

In the example in FIG. 4, the charge pump 110 includes a compensation capacitor 430 and a resistor 440 coupled in series between the drain of the third transistor 310 and the gate of the third transistor 310. In this example, the third transistor 310 acts as a common-source amplifier in which the compensation capacitor 430 is coupled between the input and the output of the common-source amplifier. In this example, the compensation capacitor 430 provides the feedback loop 428 with Miller compensation, which helps stabilize the feedback loop 428 (e.g., improve the phase margin of the feedback loop 428). The compensation capacitor 430 may also be referred to as a second capacitor.

In the above discussion, charge sharing error was assumed to be negligible. Charge sharing error may occur due to the drain capacitance of the first transistor 210 and the drain capacitance of the second transistor 215.

When the first switch 130 is turned on (i.e., closed), the drain voltage vd1 of the first transistor 210 is approximately equal to the control voltage $V_{ctl}$. However, when the first switch 130 is turned off, the drain of the first transistor 210 is decoupled from the output 155 of the charge pump 110, and the drain voltage vd1 of the first transistor 210 is pulled up to Vdd. When the first switch 130 is turned back on, charge is transferred between the drain capacitance of the first transistor 210 and the capacitor 170 to pull the drain voltage vd1 back to the control voltage $V_{ctl}$. The charge transfer causes a charge sharing error in which the control voltage $V_{ctl}$ is disturbed.

When the second switch 140 is turned on (i.e., closed), the drain voltage vd2 of the second transistor 215 is approximately equal to the control voltage $V_{ctl}$. However, when the second switch 140 is turned off, the drain of the second transistor 215 is decoupled from the output 155 of the charge pump 110, and the drain voltage vd2 of the second transistor 215 is pulled down to ground potential. When the second switch 140 is turned back on, charge is transferred between the drain capacitance of the second transistor 215 and the capacitor 170 to pull the drain voltage vd2 back to the control voltage $V_{ctl}$. The charge transfer causes a charge sharing error in which the control voltage $V_{ctl}$ is disturbed.

Figure 5:
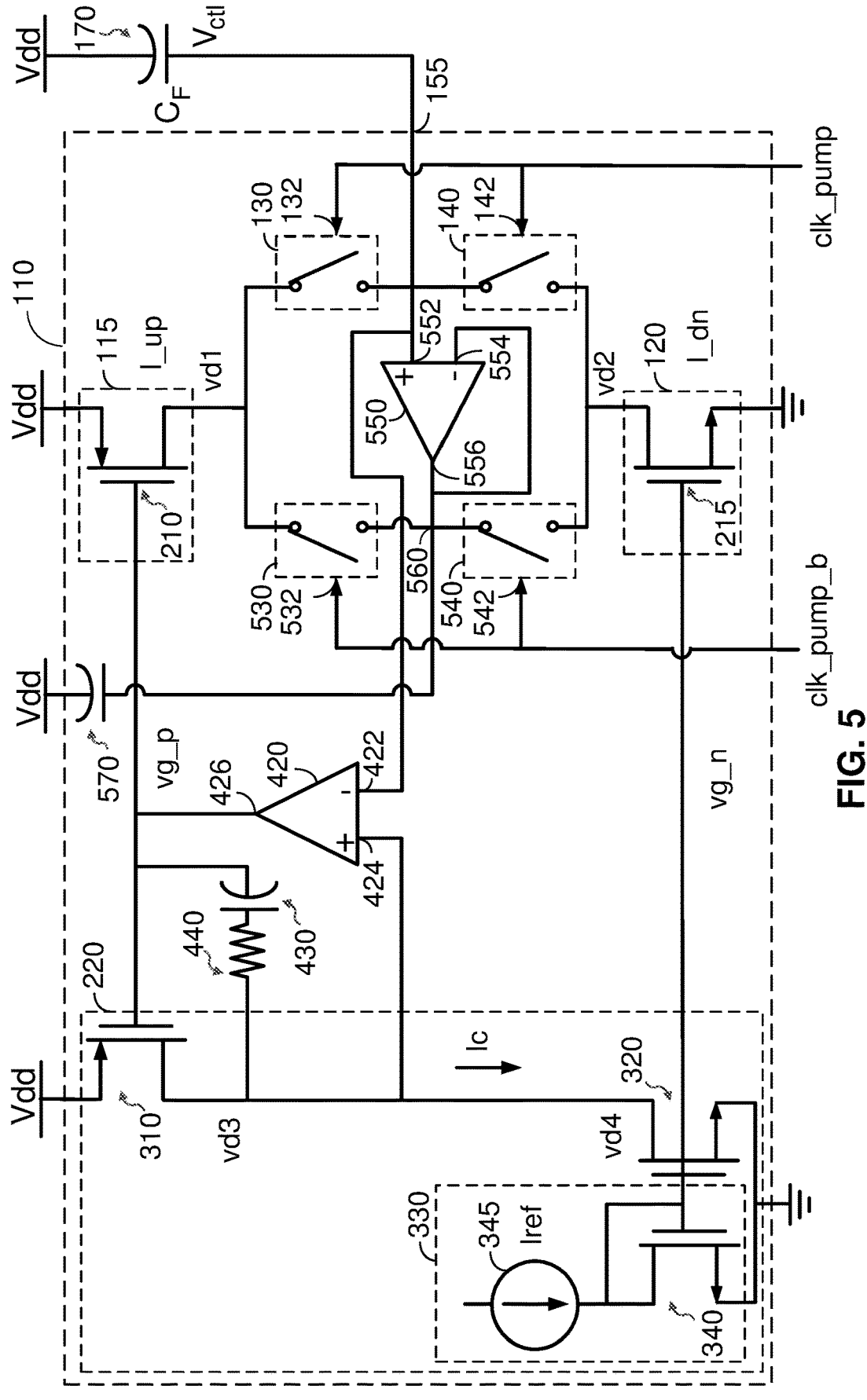
FIG. 5 shows an example in which the charge pump includes circuitry for reducing charge sharing error according to certain aspects of the present disclosure.

FIG. 5 shows an example in which the charge pump 110 includes circuitry for reducing charge sharing error. In this example, the charge pump 110 includes a third switch 530, a fourth switch 540, and a second amplifier 550.

The third switch 530 is coupled between the drain of the first transistor 210 and a node 560, and the fourth switch 540 is coupled between the node 560 and the drain of the second transistor 215. The second amplifier 550 has a first input 552 (a plus input), a second input 554 (e.g., a minus input), and an output 556. The first input 552 of the second amplifier 550 is coupled to the output 155 of the charge pump 110 and the output 556 of the second amplifier 550 is coupled to the node 560 between the switches 530 and 540. Also, the second input 554 of the second amplifier 550 is coupled to the output 556, which provides unity gain that forces the voltage at the output 556 of the second amplifier 550 (and hence the voltage at the node 560) to be approximately equal to the voltage $V_{ctl}$ at the first input 552 of the second amplifier 550. Thus, the second amplifier 550 forces the voltage at the node 560 between the switches 530 and 540 to be approximately equal to the control voltage $V_{ctl}$. In the example shown in FIG. 5, the charge pump 110 includes a capacitor 570 coupled between the node 560 and the supply rail.

The third switch 530 has a control input 532 and the fourth switch 540 has a control input 542. In this example, the third switch 530 (e.g., a PFET) may be configured to turn on when the input voltage at the control input 532 is low (e.g., ground potential) and turn off when the input voltage at the control input 532 is high (e.g., Vdd). The fourth switch 540 (e.g., an NFET) may be configured to turn on when the input voltage at the control input 542 is high (e.g., vdd) and turn off when the input voltage at the control input 542 is low (e.g., ground potential).

In the example shown in FIG. 5, the control input 532 of the third switch 530 and the control input 542 of the fourth switch 540 are driven by inverse clock signal clk_pump_b, which is the inverse (i.e., complement) of the clock signal clk_pump driving the control input 132 of the first switch 130 and the control input 142 of the second switch 140. As a result, the third switch 530 turns on when the first switch 130 turns off, and the fourth switch 540 turns on when the second switch 140 turns off.

In this example, when the first switch 130 is turned off by the clock signal clk_pump, the third switch 530 is turned on by the inverse clock signal clk_pump_b. The third switch 530 couples the drain of the first transistor 210 to the node 560, which has a voltage approximately equal to the control voltage $V_{ctl}$ due to the second amplifier 550. As a result, the drain voltage vd1 of the first transistor 210 is maintained at the control voltage $V_{ctl}$ while the first switch 130 is turned off. This reduces the charge sharing error when the first switch 130 is turned back on.

When the second switch 140 is turned off by the clock signal clk_pump, the fourth switch 540 is turned on by the inverse clock signal clk_pump_b. The fourth switch 540 couples the drain of the second transistor 215 to the node 560, which has a voltage approximately equal to the control voltage $V_{ctl}$ due to the second amplifier 550. As a result, the drain voltage vd2 of the second transistor 215 is maintained at the control voltage $V_{ctl}$ while the second switch 140 is turned off. This reduces the charge sharing error when the second switch 140 is turned back on.

Figure 6:
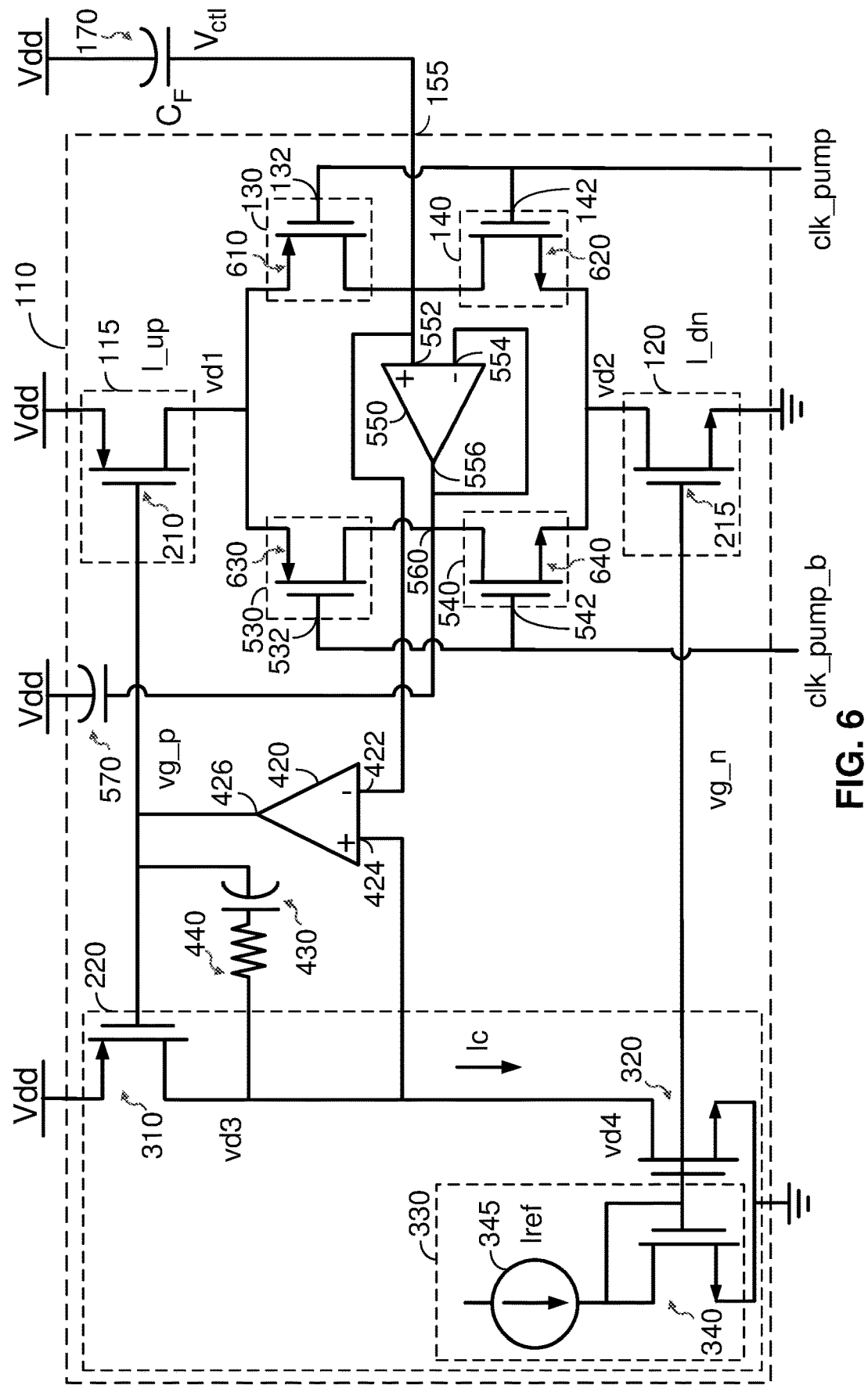
FIG. 6 shows an exemplary implementation of switches in the charge pump according to certain aspects of the present disclosure.

FIG. 6 shows an example where the first switch 130 includes a first PFET 610, the second switch 140 includes a first NFET 620, the third switch 530 includes a second PFET 630, and the fourth switch 540 includes a second NFET 640. In this example, the source of the first PFET 610 is coupled to the drain of the first transistor 210, the gate of the first PFET 610 is coupled to the control input 132, and the drain of the first PFET 610 is coupled to the output 155. The source of the second PFET 630 is coupled to the drain of the first transistor 210, the gate of the second PFET 630 is coupled to the control input 532, and the drain of the second PFET 630 is coupled to the node 560. The drain of the first NFET 620 is coupled to the output 155, the gate of the first NFET 620 is coupled to the control input 142, and the source of the first NFET 620 is coupled to the drain of the second transistor 215. The drain of the second NFET 640 is coupled to the node 560, the gate of the second NFET 640 is coupled to the control input 542, and the source of the second NFET 640 is coupled to the drain of the second transistor 215. It is to be appreciated that the switches 130, 140, 530, and 540 are not limited to the exemplary implementation shown in FIG. 6.

Figure 7:
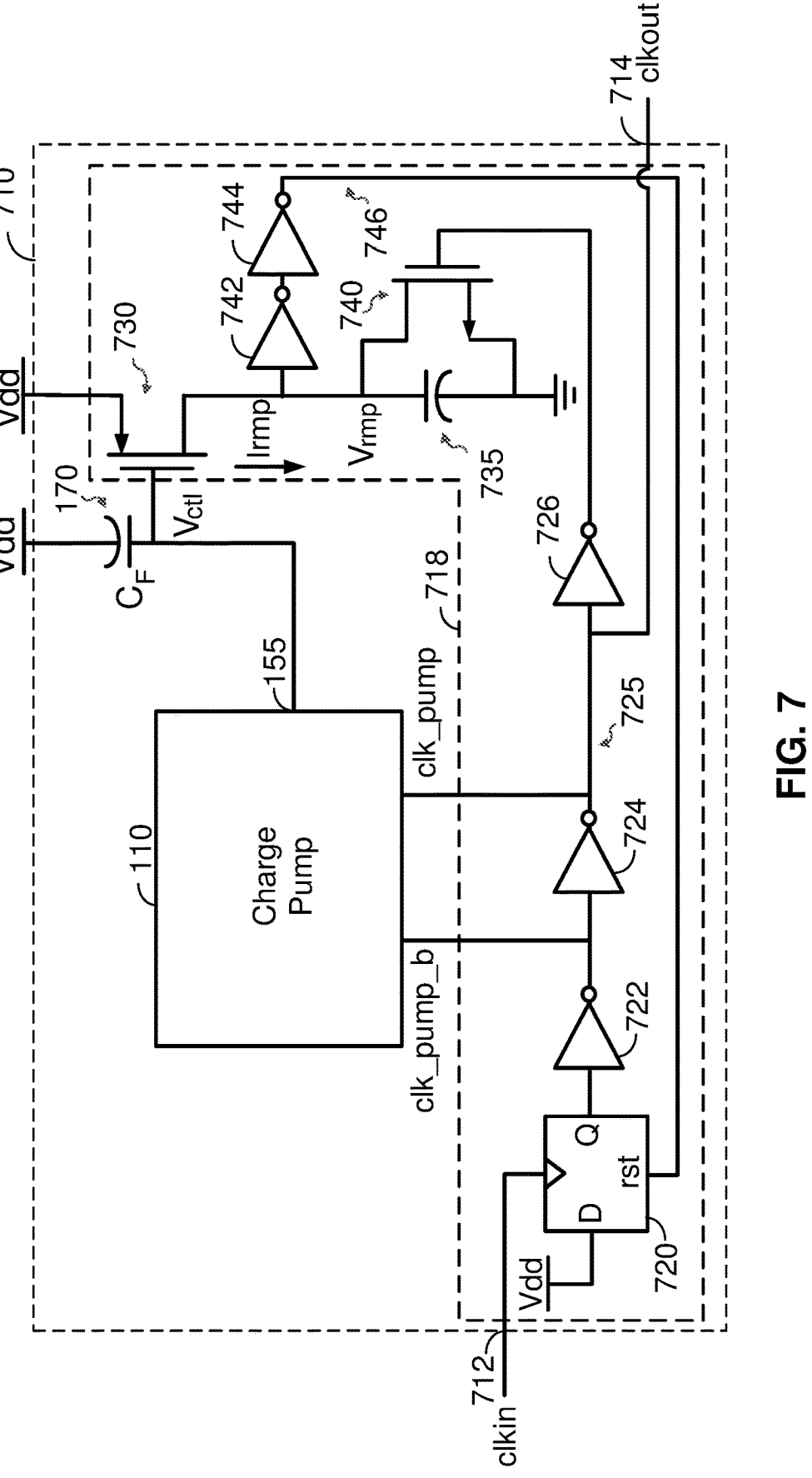
FIG. 7 shows an example of a duty cycle corrector including the charge pump according to certain aspects of the present disclosure.

As discussed above, the charge pump 110 may be used in a duty cycle corrector. In this regard, FIG. 7 shows an example of a duty cycle corrector 710 including the charge pump 110 according to certain aspects. The duty cycle corrector 710 has an input 712 and an output 714. The duty cycle corrector 710 is configured to receive an input clock signal clkin at the input 712, adjust the duty cycle of the input clock signal clkin to obtain an output clock signal clkout, and output the output clock signal clkout at the output 714. For example, the input clock signal clkin may have large duty cycle distortion that causes the input clock signal clkin to deviate from a target duty cycle (e.g., 50 percent). The large duty cycle distortion may be caused by a long routing distance, a low supply voltage, a low performance clock generator (e.g., PLL), and/or any combination thereof. In this example, the duty cycle corrector 710 adjusts the duty cycle of the input clock signal clkin to a duty cycle closer to the target duty cycle (e.g., 50 percent).

In this example, the duty cycle corrector 710 includes a feedback circuit 718 configured to adjust the duty cycle of the clock signal clk_pump based on the control voltage $V_{ctl}$. The feedback circuit 718 includes a flip-flop 720, a clock path 725, a first transistor 730 (e.g., a PFET), a second transistor 740 (e.g., an NFET), and a second capacitor 735. In the discussion below, the capacitor 170 is referred to as the first capacitor 170.

The flip-flop 720 has a clock input coupled to the input 712 to receive the clock signal clkin. The flip-flop 720 also has an input D coupled to the supply rail to receive the supply voltage Vdd (i.e., logic one). The flip-flop 720 also has an output Q and a reset input rst. The reset input rst is configured to reset the output Q low when the reset input rst receives a rising edge (i.e., transition from low to high).

The clock path 725 is coupled between the output Q of the flip-flop 720 and the gate of the second transistor 740. In this example, the clock path 725 includes a first inverter 722, a second inverter 724, and a third inverter 726 coupled in series between the output Q of the flip-flop 720 and the gate of the second transistor 740. In this example, the clock signal clk_pump input to the charge pump 110 is taken from the output of the second inverter 724, and the inverse clock signal clk_pump_b input to the charge pump 110 is taken from the output of the first inverter 722. The clock signal clk_pump and the inverse clock signal clk_pump_b are complementary since the second inverter 724 is between the clock signals clk_pump and clk_pump_b. The output 714 of the duty cycle corrector 710 is coupled to the output of the second inverter 724. Thus, in this example, the output clock signal clkout is provided at the output 714 by the output Q of the flip-flop 720 after propagating through the inverters 722 and 724. However, it is to be appreciated that the present disclosure is not limited to this example. In this example, the clock signal clk_pump and the output clock signal clkout are the same since they are both taken from the output of the second inverter 724. However, it is to be appreciated that the present disclosure is not limited to this example.

The source of the first transistor 730 is coupled to the supply rail and the gate of the first transistor 730 is coupled between the first capacitor 170 and the output 155 of the charge pump 110 to receive the control voltage $V_{ctl}$. As discussed further below, the first transistor 730 provides a charging current Irmp to the second capacitor 735 based on the control voltage $V_{ctl}$. For the example where the first transistor 730 is implemented with a PFET, the charging current Irmp increases when the control voltage $V_{ctl}$ decreases, and the charging current Irmp decreases when the control voltage $V_{ctl}$ increases.

The second capacitor 735 is coupled between the drain of the first transistor 730 and ground. The second transistor 740 is coupled in parallel with the second capacitor 735 in which the drain of the second transistor 740 is coupled between the drain of the first transistor 730 and the second capacitor 735 and the source of the second capacitor 735 is coupled to ground. As mentioned above, the clock path 725 is coupled between the output Q of the flip-flop 720 and the gate of the second transistor 740. In this example, the second transistor 740 is configured to turn on when the gate of the second transistor 740 is high, and turn off when the gate of the second transistor 740 is low. When the second transistor 740 is turned on, the second transistor 740 provides a short that discharges the second capacitor 735, causing the voltage Vrmp on the second capacitor 735 to go to ground. When the second transistor 740 is turned off, the charging current Irmp charges the second capacitor 735, causing the voltage Vrmp on the second capacitor 735 to ramp up.

The reset input rst of the flip-flop 720 is coupled to the capacitor 735 through a reset path 746. In the example shown in FIG. 7, the reset path 746 includes inverters 742 and 744 coupled in series. In this example, the reset input rst of the flip-flop 720 is configured to reset the output Q of the flip-flop 720 low when the voltage Vrmp on the second capacitor 735 reaches the threshold voltage of the inverter 742. As used herein, a "threshold voltage" of an inverter is the voltage at the input of the inverter that causes the output of the inverter to transition from high to low. For example, the threshold voltage of the inverter 742 may be approximately equal to Vdd/2. In this example, the inverters 742 and 744 cause the reset input rst of the flip-flop 720 to reset the output Q of the flip-flop 720 low when the voltage Vrmp on the second capacitor 735 reaches the threshold voltage (e.g., Vdd/2) of the inverter 742. It is to be appreciated that the reset path 746 is not limited to the example shown in FIG. 7, and that the reset path 746 may include a different number of inverters or no inverter in some implementations.

Exemplary operation of the duty cycle corrector 710 will now be described according to certain aspects. When the flip-flop 720 receives a rising edge of the clock signal clkin, the flip-flop 720 is configured to latch the logic one at the input D, and output the latched logic one at the output Q. This causes the output Q of the flip-flop 720 to output a rising edge assuming the output Q is initially reset low. The rising edge at the output Q of the flip-flop 720 is output at the output 714 of the duty cycle corrector 710 after propagating through the inverters 722 and 744. The rising edge at the output 714 provides a rising edge of the output clock signal clkout.

The inverse clock signal clk_pump_b is input to the charge pump 110 from the output of the first inverter 722 and the clock signal clk_pump is input to the charge pump 110 from the output of the second inverter 724. The charge pump 110 tunes (i.e., adjusts) the control voltage V_ctl based on the duty cycle of the clock signal clk_pump, as discussed above.

The rising edge at the output Q of the flip-flop 720 causes the voltage at the gate of the second transistor 740 to go low. This is because the gate of the second transistor 740 is coupled to the output Q through an odd number of inverters (i.e., inverters 722, 724, and 725). When the voltage at the gate of the second transistor 740 goes low, the second transistor 740 turns off, which allows the charging current Irmp from the first transistor 730 to charge the second capacitor 735. As discussed above, the charging current Irmp is a function of the control voltage V_ctl input to the gate of the first transistor 730. The charging current Irmp causes the voltage Vrmp at the second capacitor 735 to ramp up. When the voltage Vrmp reaches the threshold voltage (e.g., Vdd/2) of the inverter 742, the output of the inverter 742 goes low which causes the output of the inverter 744 to go high. The high output of the inverter 744 is input to the reset input rst of the flip-flop 720, causing the output Q of the flip-flop 720 to reset to logic zero and output a falling edge. The falling edge propagates through the inverters 722 and 724 to the output 714 of the duty cycle corrector 710 to provide a falling edge of the output clock signal clkout.

In this example, the delay of the falling edge of the output clock signal clkout with respect to the rising edge of the output clock signal clkout depends on how quickly the flip-flop 720 is reset to zero after the rising edge. The time it takes to reset the flip-flop 720 depends on the time it takes for the voltage Vrmp on the second capacitor 735 to ramp up to the threshold voltage (e.g., Vdd/2) of the inverter 742, which, in turn, depends on the charging current Irmp. The charging current Irmp, in turn, depends on the control voltage V_ctl. Thus, the delay of the falling edge of the output clock signal clkout with respect to the rising edge of the output clock signal clkout depends the control voltage V_ctl, which is tuned by the charge pump 110 based on the duty cycle of the clock signal clk_pump. In this example, the control voltage V_ctl controls the duty cycle of the output clock signal clkout by controlling the delay of the falling edge of the output clock signal clkout with respect to the rising edge of the output clock signal clkout. Increasing the delay increases the duty cycle while decreasing the delay decreases the duty cycle. The control voltage V_ctl also controls the duty cycle of the clock signal clk_pump in a similar manner.

Figure 8:
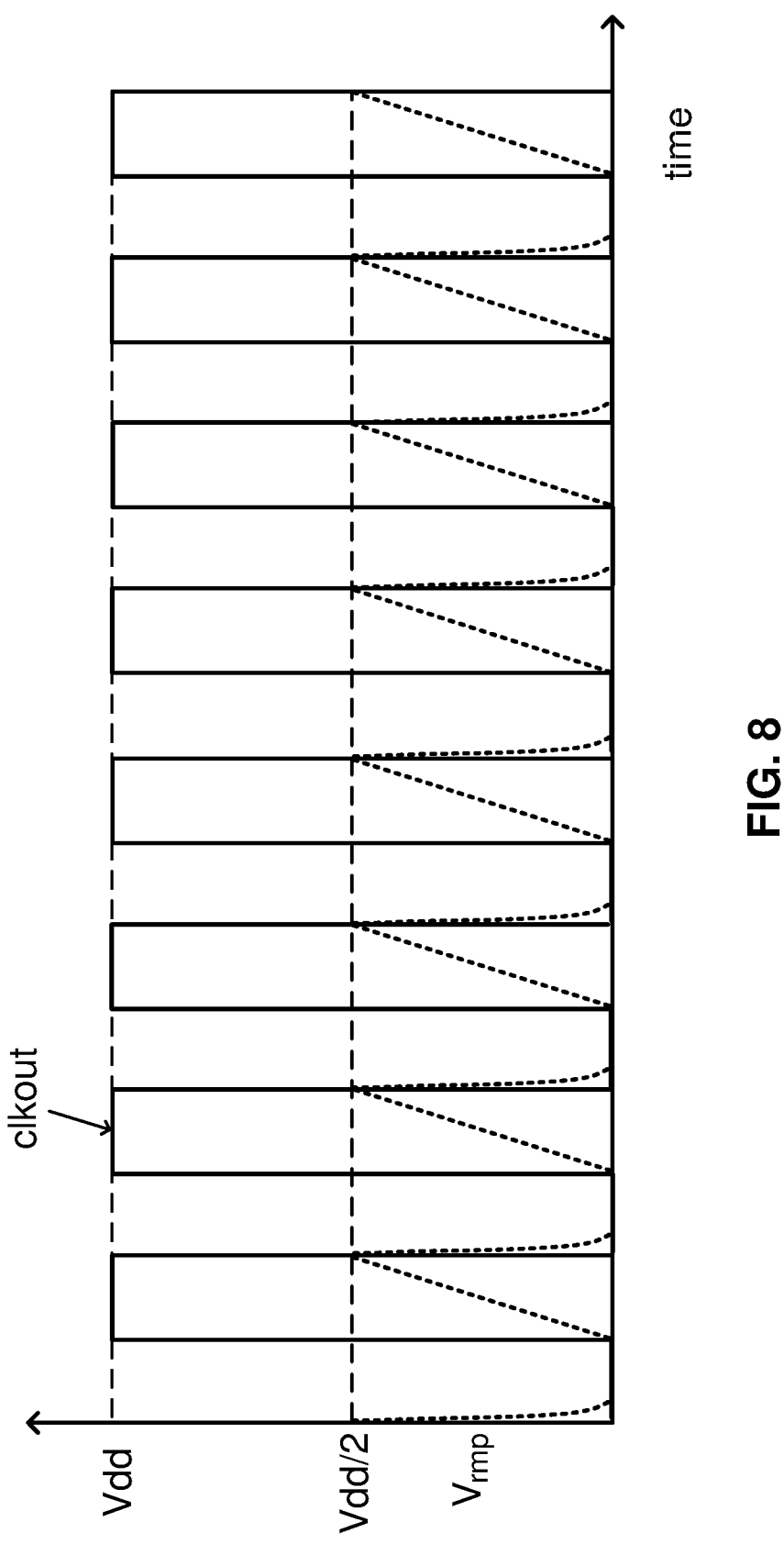
FIG. 8 is a timing diagram showing an exemplary waveform of a ramp voltage according to certain aspects of the present disclosure.

FIG. 8 is a timing diagram showing an exemplary waveform of the voltage Vrmp on the second capacitor 735 over multiple clock cycles. As shown in FIG. 8, during each clock cycle, the voltage Vrmp ramps up to the threshold voltage (e.g., Vdd/2) of the inverter 742. Each time the voltage Vrmp reaches the threshold voltage, the flip-flop 720 is reset to zero and the second transistor 740 turns on, which discharges the second capacitor 735 and causes the voltage Vrmp to fall to ground potential.

Figure 9:
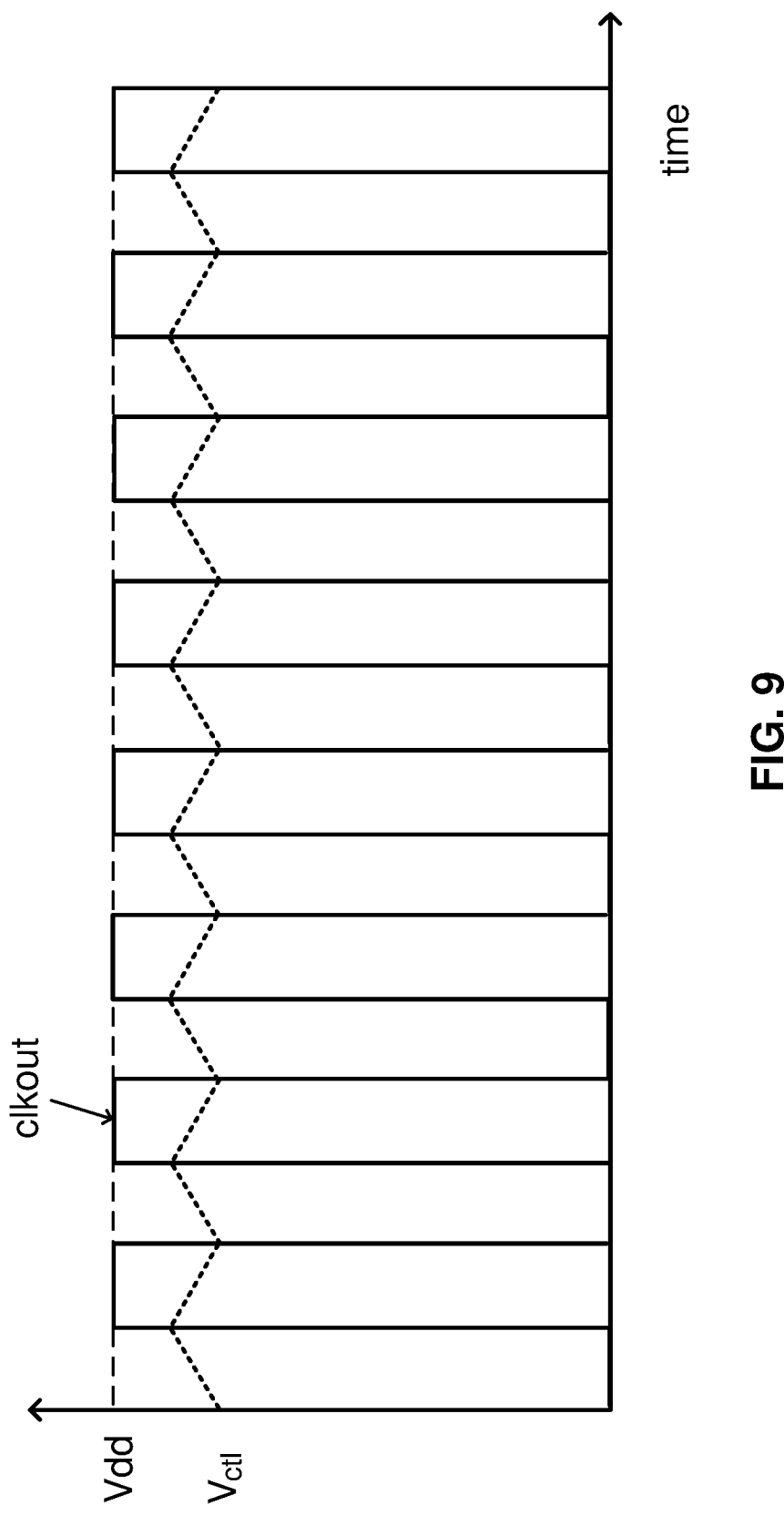
FIG. 9 is a timing diagram showing an exemplary waveform of a control voltage according to certain aspects of the present disclosure.

FIG. 9 is a timing diagram showing an exemplary waveform of the control voltage V_ctl over multiple clock cycles. In this example, the control voltage V_ctl is in a steady state in which the control voltage V_ctl oscillates around an average value. As shown in FIG. 9, the control voltage V_ctl ramps up slightly each time the clock signal clkout is low and ramps down slightly each time the clock signal clkout is high resulting in a sawtooth waveform. The sawtooth waveform may cause a small duty cycle error. The impact of the sawtooth waveform on the duty cycle error may be reduced by reducing the swing of the sawtooth waveform. The swing may be reduced by increasing the capacitance of the first capacitor 170, which smooths out the waveform of the control voltage V_ctl. However, increasing the capacitance increases the area of the first capacitor 170.

In certain aspects, the bandwidth of the amplifier 420 (shown in FIGS. 4 to 6) may be high enough to track the sawtooth waveform of the control voltage V_ctl. In these aspects, the drain voltages Vd3 and Vd4 of the transistors 310 and 320 track the sawtooth waveform of the control voltage V_ctl. The tracking reduces the impact of the sawtooth waveform on the duty cycle error without the need to increase the size of the first capacitor 170, which improves area efficiency compared with increasing the size of the first capacitor 170.

Figure 10:
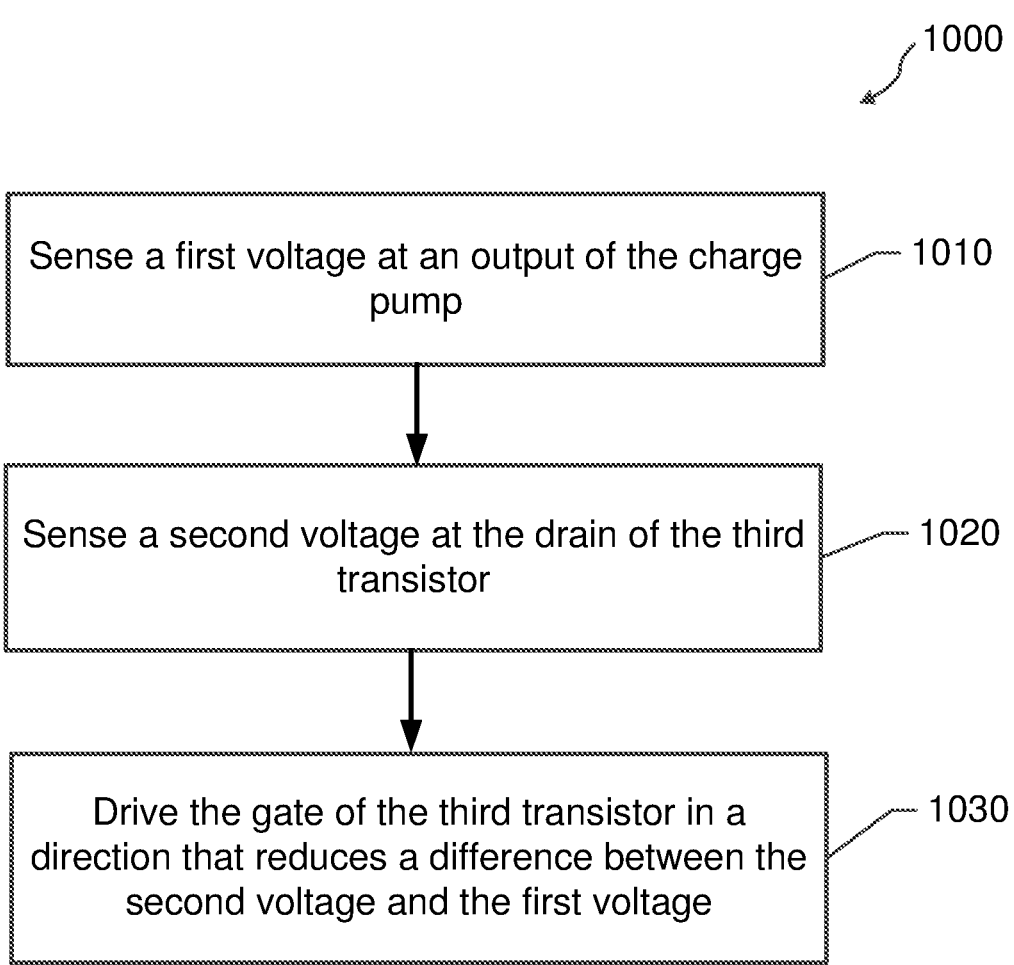
FIG. 10 is a flowchart illustrating a method for operating a charge pump according to certain aspects of the present disclosure.

FIG. 10 shows an exemplary method for operating a charge pump according to certain aspects. The charge pump (e.g., the charge pump 110) includes a first transistor (e.g., the first transistor 210) providing a first current (e.g., I_up), a second transistor (e.g., the second transistor 215) providing a second current (e.g., I_dn), a third transistor (e.g., the third transistor 310), a fourth transistor (e.g., the fourth transistor 320), and a bias circuit (e.g., the bias circuit 330) biasing a gate of the second transistor and a gate of the fourth transistor, wherein a gate of the third transistor is coupled to a gate of the first transistor, and a drain of the third transistor is coupled to a drain of the fourth transistor.

At block 1010, a first voltage at an output of the charge pump is sensed. For example, the first voltage may correspond to the control voltage $V_{ctl}$. The first voltage may be sensed at the first input 422 of the first amplifier 420.

At block 1020, a second voltage at the drain of the third transistor is sensed. For example, the second voltage may correspond to the drain voltage vd3. The second voltage may be sensed at the second input 424 of the first amplifier 420.

At block 1030, the gate of the third transistor is driven in a direction that reduces a difference between the second voltage and the first voltage. For example, the gate of the third transistor may be driven by the output 426 of the first amplifier 420.

In certain aspects, the charge pump further includes a first switch (e.g., first switch 130) coupled between the first transistor and the output of the charge pump, and a second switch (e.g., second switch 140) coupled between the output of the charge pump and the second transistor. In these aspects, the method 1000 may further include receiving a clock signal (e.g., clk_pump), and driving the first switch and the second switch based on the clock signal.

In certain aspects, driving the first switch and the second switch based on the clock signal includes turning on the first switch and turning off the second switch when the clock signal is low, and turning off the first switch and turning on the second switch when the clock signal is high.

In certain aspects, the method 1000 also includes adjusting a duty cycle of the clock signal based on the first voltage at the output of the charge pump. For example, the duty cycle of the clock signal may be adjusted by the feedback circuit 718.

Implementation examples are described in the following numbered clauses:

1. A system, comprising:
a charge pump, comprising:
a first transistor;
a first switch coupled between a drain of the first transistor and an output of the charge pump;
a second transistor;
a second switch coupled between the output of the charge pump and a drain of the second transistor;
a third transistor, wherein a gate of the third transistor is coupled to a gate of the first transistor;
a fourth transistor, wherein a drain of the fourth transistor is coupled to a drain of the third transistor;
a bias circuit configured to bias a gate of the fourth transistor and a gate of the second transistor; and
a first amplifier having a first input, a second input, and an output, wherein the first input of the first amplifier is coupled to the output of the charge pump, the second input of the first amplifier is coupled to the drain of the third transistor, and the output of the first amplifier is coupled to the gate of the third transistor and the gate of the first transistor; and
a first capacitor coupled to the output of the charge pump.

2. The system of clause 1, wherein the charge pump further comprises a second capacitor coupled between the drain of the third transistor and the gate of the third transistor.

3. The system of clause 1 or 2, wherein the first capacitor is coupled between the output of the charge pump and a supply rail.

4. The system of any one of clauses 1 to 3, wherein a source of the first transistor and a source of the third transistor are coupled to a supply voltage, and a source of the second transistor and a source of the fourth transistor are coupled to a ground.

5. The system of clause 4, wherein the first transistor comprises a first p-type field effect transistor (PFET), the second transistor comprises a first n-type field effect transistor (NFET), the third transistor comprises a second PFET, and the fourth transistor comprises a second NFET.

6. The system of any one of clauses 1 to 5, wherein the bias circuit comprises:
a reference current source; and
a fifth transistor, wherein a drain of the fifth transistor is coupled to the reference current source, and a gate of the fifth transistor is coupled to the drain of the fifth transistor, the gate of the fourth transistor, and the gate of the second transistor.

7. The system of clause 6, wherein a source of the first transistor and a source of the third transistor are coupled to a supply voltage, and a source of the second transistor, a source of the fourth transistor, and a source of the fifth transistor are coupled to a ground.

8. The system of any one of clauses 1 to 7, wherein the first switch and the second switch are driven by a clock signal.

9. The system of clause 8, wherein:
the first switch is configured to turn on when the clock signal is low and turn off when the clock signal is high; and
the second switch is configured to turn on when the clock signal is high and turn off when the clock signal is low.

10. The system of clause 8 or 9, wherein the first switch comprises a p-type field effect transistor (PFET), the second switch comprises an n-type field effect transistor (NFET).

11. The system of any one of clauses 8 to 10, further comprising a feedback circuit configured to adjust a duty cycle of the clock signal based on a control voltage on the first capacitor.

12. The system of any one of clauses 1 to 11, wherein the charge pump further comprises:
a third switch coupled between the drain of the first transistor and a node;
a fourth switch coupled between the node and the drain of the second transistor; and
a second amplifier having a first input, a second input, and an output, wherein the first input of the second amplifier is coupled to the output of the charge pump, the second input of the second amplifier is coupled to the output of the second amplifier, and the output of the second amplifier is coupled to the node.

13. The system of clause 12, wherein:
the first switch and the second switch are driven by a clock signal; and
the third switch and the fourth switch are driven by an inverse of the clock signal.

14. The system of clause 13, wherein:
the first switch is configured to turn on when the clock signal is low and turn off when the clock signal is high;
the second switch is configured to turn on when the clock signal is high and turn off when the clock signal is low;
the third switch is configured to turn on when the inverse of the clock signal is low and turn off when the inverse of the clock signal is high; and
the fourth switch is configured to turn on when the inverse of the clock signal is high and turn off when the inverse of the clock signal is low.

15. The system of clause 13 or 14, wherein the first switch comprises a first p-type field effect transistor (PFET), the second switch comprises a first n-type field effect transistor (NFET), the third switch comprises a second PFET, and the fourth switch comprises a second NFET.

16. The system of any one of clauses 13 to 15, further comprising a feedback circuit configured to adjust a duty cycle of the clock signal based on a control voltage on the first capacitor.

17. A method for operating a charge pump, the charge pump including a first transistor providing a first current, a second transistor providing a second current, a third transistor, a fourth transistor, and a bias circuit biasing a gate of the second transistor and a gate of the fourth transistor, wherein a gate of the third transistor is coupled to a gate of the first transistor, and a drain of the third transistor is coupled to a drain of the fourth transistor, the method comprising:

sensing a first voltage at an output of the charge pump;

sensing a second voltage at the drain of the third transistor; and driving the gate of the third transistor in a direction that reduces a difference between the second voltage and the first voltage.

18. The method of clause 17, wherein the charge pump further comprises a first switch coupled between the first transistor and the output of the charge pump, and a second switch coupled between the output of the charge pump and the second transistor, and wherein the method further comprises:

receiving a clock signal; and driving the first switch and the second switch based on the clock signal.

19. The method of clause 18, wherein driving the first switch and the second switch based on the clock signal comprises:

turning on the first switch and turning off the second switch when the clock signal is low; and turning off the first switch and turning on the second switch when the clock signal is high.

20. The method of clause 18 or 19, further comprising adjusting a duty cycle of the clock signal based on the first voltage at the output of the charge pump.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. It is also to be appreciated that the term "ground" may refer to a DC ground or an AC ground, and thus the term "ground" covers both possibilities. As used herein, "approximately" means within 90 percent to 110 percent of the stated value.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A system, comprising:

a charge pump, comprising:

a first transistor;

a first switch coupled between a drain of the first transistor and an output of the charge pump;

a second transistor;

a second switch coupled between the output of the charge pump and a drain of the second transistor;

a third transistor, wherein a gate of the third transistor is coupled to a gate of the first transistor;

a fourth transistor, wherein a drain of the fourth transistor is coupled to a drain of the third transistor;

a bias circuit configured to bias a gate of the fourth transistor and a gate of the second transistor; and a first amplifier having a first input, a second input, and an output, wherein the first input of the first amplifier is coupled to the output of the charge pump, the second input of the first amplifier is coupled to the drain of the third transistor, and the output of the first amplifier is coupled to the gate of the third transistor; and a first capacitor coupled to the output of the charge pump.

2. The system of claim 1, wherein the charge pump further comprises a second capacitor coupled between the drain of the third transistor and the gate of the third transistor.

3. The system of claim 1, wherein the first capacitor is coupled between the output of the charge pump and a supply rail.

4. The system of claim 1, wherein a source of the first transistor and a source of the third transistor are coupled to a supply voltage, and a source of the second transistor and a source of the fourth transistor are coupled to a ground.

5. The system of claim 4, wherein the first transistor comprises a first p-type field effect transistor (PFET), the second transistor comprises a first n-type field effect transistor (NFET), the third transistor comprises a second PFET, and the fourth transistor comprises a second NFET.

6. The system of claim 1, wherein the bias circuit comprises:

a reference current source; and a fifth transistor, wherein a drain of the fifth transistor is coupled to the reference current source, and a gate of the fifth transistor is coupled to the drain of the fifth transistor, the gate of the fourth transistor, and the gate of the second transistor.

7. The system of claim 6, wherein a source of the first transistor and a source of the third transistor are coupled to a supply voltage, and a source of the second transistor, a source of the fourth transistor, and a source of the fifth transistor are coupled to a ground.

8. The system of claim 1, wherein the first switch and the second switch are driven by a clock signal.

9. The system of claim 8, wherein:

the first switch is configured to turn on when the clock signal is low and turn off when the clock signal is high; and the second switch is configured to turn on when the clock signal is high and turn off when the clock signal is low.

10. The system of claim 8, wherein the first switch comprises a p-type field effect transistor (PFET), and the second switch comprises an n-type field effect transistor (NFET).

11. The system of claim 8, further comprising a feedback circuit configured to adjust a duty cycle of the clock signal based on a control voltage on the first capacitor.

12. The system of claim 1, wherein the charge pump further comprises:

a third switch coupled between the drain of the first transistor and a node;

a fourth switch coupled between the node and the drain of the second transistor; and a second amplifier having a first input, a second input, and an output, wherein the first input of the second amplifier is coupled to the output of the charge pump, the second input of the second amplifier is coupled to the output of the second amplifier, and the output of the second amplifier is coupled to the node.

13. The system of claim 12, wherein:

the first switch and the second switch are driven by a clock signal; and the third switch and the fourth switch are driven by an inverse of the clock signal.

14. The system of claim 13, wherein:

the first switch is configured to turn on when the clock signal is low and turn off when the clock signal is high;

the second switch is configured to turn on when the clock signal is high and turn off when the clock signal is low;

the third switch is configured to turn on when the inverse of the clock signal is low and turn off when the inverse of the clock signal is high; and the fourth switch is configured to turn on when the inverse of the clock signal is high and turn off when the inverse of the clock signal is low.

15. The system of claim 13, wherein the first switch comprises a first p-type field effect transistor (PFET), the second switch comprises a first n-type field effect transistor (NFET), the third switch comprises a second PFET, and the fourth switch comprises a second NFET.

16. The system of claim 13, further comprising a feedback circuit configured to adjust a duty cycle of the clock signal based on a control voltage on the first capacitor.

17. A method for operating a charge pump, the charge pump including a first transistor providing a first current, a second transistor providing a second current, a first switch coupled between the first transistor and an output of the charge pump, a second switch coupled between the output of the charge pump and the second transistor, a third transistor, a fourth transistor, and a bias circuit biasing a gate of the second transistor and a gate of the fourth transistor, wherein a gate of the third transistor is coupled to a gate of the first transistor, and a drain of the third transistor is coupled to a drain of the fourth transistor, the method comprising:

sensing a first voltage at the output of the charge pump;

sensing a second voltage at the drain of the third transistor;

driving the gate of the third transistor in a direction that reduces a difference between the second voltage and the first voltage;

receiving a clock signal; and driving the first switch and the second switch based on the clock signal.

18. The method of claim 17, wherein driving the first switch and the second switch based on the clock signal comprises:

turning on the first switch and turning off the second switch when the clock signal is low; and turning off the first switch and turning on the second switch when the clock signal is high.

19. The method of claim 17, further comprising adjusting a duty cycle of the clock signal based on the first voltage at the output of the charge pump.

* * * * *